(12) United States Patent
Joshi et al.

(10) Patent No.: US 8,799,732 B2
(45) Date of Patent: *Aug. 5, 2014

(54) METHODOLOGY FOR CORRELATED MEMORY FAIL ESTIMATIONS

(75) Inventors: Rajiv V. Joshi, Yorktown Heights, NY (US); Rouwaida N. Kanj, Round Rock, TX (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 269 days.

This patent is subject to a terminal disclaimer.

(21) Appl. No.: 13/369,633

(22) Filed: Feb. 9, 2012

(65) Prior Publication Data
US 2013/0212444 A1 Aug. 15, 2013

(51) Int. Cl.
G11C 29/00 (2006.01)
G06F 11/00 (2006.01)
G11C 29/08 (2006.01)
G06F 17/18 (2006.01)

(52) U.S. Cl.
CPC .............. *G11C 29/08* (2013.01); *G06F 17/18* (2013.01)
USPC ........................... 714/741; 714/723; 714/718

(58) Field of Classification Search
CPC .. G11C 29/08; G11C 29/56008; G11C 29/44; G06F 17/50; G06F 2217/10; G06F 9/455; G06F 11/00; G06F 17/18; G06F 17/5045
USPC ................... 714/718, 723, 724, 741
See application file for complete search history.

(56) References Cited

U.S. PATENT DOCUMENTS

| 4,628,509 | A  | * | 12/1986 | Kawaguchi | 714/711 |
| 6,701,477 | B1 | * | 3/2004  | Segal | 714/732 |
| 7,113,988 | B2 | * | 9/2006  | Chirashnya et al. | 709/224 |
| 7,380,225 | B2 |   | 5/2008  | Joshi et al. | |
| 8,214,190 | B2 | * | 7/2012  | Joshi et al. | 703/13 |

OTHER PUBLICATIONS

Sugimoto, M.; Tanaka, M., "Characterization algorithm of failure distribution for LSI yield improvement," Semiconductor Manufacturing Symposium, 2001 IEEE International , vol., No., pp. 275,278, 2001.*

(Continued)

*Primary Examiner* — Cynthia Britt
(74) *Attorney, Agent, or Firm* — Garg Law Firm, PLLC; Rakesh Garg; John D. Flynn

(57) ABSTRACT

Correlated failure distribution for memory arrays having different groupings of memory cells is estimated by constructing memory unit models for the groupings based on multiple parameters, establishing failure conditions of the memory unit model using fast statistical analysis, calculating a fail boundary of the parameters for each memory unit model based on its corresponding failure conditions, and constructing memory array models characterized by the fail boundaries. Operation of a memory array model is repeatedly simulated with random values of the parameters assigned to the memory cells and peripheral logic elements to identify memory unit failures for each simulated operation. A mean and a variance is calculated for each memory array model, and an optimal architecture can thereafter be identified by selecting the grouping exhibiting the best mean and variance, subject to any other circuit requirements such as power or area.

20 Claims, 5 Drawing Sheets

(56) References Cited

OTHER PUBLICATIONS

Gleixner, B.; Pirovano, A.; Sarkar, J.; Ottogalli, F.; Tortorelli, E.; Tosi, M.; Bez, R., "Data Retention Characterization of Phase-Change Memory Arrays," Reliability physics symposium, 2007. proceedings. 45th annual. ieee international , vol., No., pp. 542,546, Apr. 15-19, 2007.*

Khalil, D.E.; Khellah, M.; Nam-Sung Kim; Ismail, Y.; Karnik, T.; De, V.K., "Accurate Estimation of SRAM Dynamic Stability," Very Large Scale Integration (VLSI) Systems, IEEE Transactions on , vol. 16, No. 12, pp. 1639,1647, Dec. 2008.*

Jeffery, C.M.; Figueiredo, R.J.O., "Hierarchical fault tolerance for nanoscale memories," Nanotechnology, IEEE Transactions on , vol. 5, No. 4, pp. 407,414, Jul. 2006.*

Houle, Robert, "Simple Statistical Analysis Techniques to Determine Minimum Sense Amp Set Times," IEEE 2007 Custom Integrated Circuits Conference, pp. 37-40 (2007).

* cited by examiner

METHODOLOGY FOR CORRELATED MEMORY FAIL ESTIMATIONS

BACKGROUND OF THE INVENTION

1. Field of the Invention

The present invention generally relates to methods for determining yields of circuit components in integrated circuit designs, and more particularly to a method of determining correlated fail distributions (e.g., memory read failures) in memory arrays having memory cells formed into groups which connect to a single peripheral logic element.

2. Description of the Related Art

Integrated circuits are used for a wide variety of electronic applications, from simple devices such as wristwatches, to the most complex computer systems. Although great care is taken in the design and fabrication of integrated circuits, there is still a small percentage of electrical components that can fail for various reasons including process variations, defective designs or incomplete testing. Even if the percentage of failing components is very small, it may still equate to a significant number of absolute failures when considering components having a very large quantity of circuit elements. For example, an integrated circuit (IC) chip for a state-of-the-art random-access memory (RAM) array may have millions of memory cells (bits), plus additional peripheral logic for local or global evaluation. Furthermore, unlike logic circuitry, a single or a few failing memory cells can lead to significant yield loss.

Means have been devised to mitigate the effects of component failures, such as the provision of error-correcting circuits or redundant circuits which enable recovery for a limited number of fails. However, with designers aiming for less than one part-per-million fails in memory designs, it is increasingly important to be able to pre-characterize the failures taking into consideration the impact of process variation parameters on yield and design considerations. In the case of memory circuits, designers are particularly interested in process variation within the transistors of the memory cells.

This challenge is becoming more difficult as process technology scales to the deep-submicron regime. Process variation in the peripheral logic, namely local evaluation circuitry in case of SRAM or primary sense amp in case of eDRAM, becomes critical as well. One design consideration which affects memory array yield is the manner in which the memory cells are connected to the peripheral logic, which may be understood by reference to the basic examples of FIGS. 1A, 1B and 1C. FIG. 1A illustrates a memory array 1 in which each memory cell 2 is connected to its own sense amplifier 4, i.e., the memory cell grouping is 1:1. In the example under consideration memory array 1 has ten such memory groups, and a set of ten of these memory arrays are replicated for a total of one hundred memory cells. FIG. 1B illustrates a memory array 6 in which two memory cells 2 are connected to a single sense amplifier 4, i.e., the memory cell grouping is 2:1. Memory array 6 has five such memory groups, and a set of ten of these memory arrays are again replicated for a total of one hundred memory cells. FIG. 1C illustrates a memory array 8 in which ten memory cells 2 are connected to a single sense amplifier 4, i.e., the memory cell grouping is 10:1. Memory array 8 has one such memory group, and a set of ten of these memory arrays are again replicated for a total of one hundred memory cells. Each memory cell plus its associated sense amplifier is considered to be a memory unit.

Without loss of generality, the effect of memory cell grouping on memory unit failure distribution can be seen by comparing the mean and standard deviation for failures of these sets of the three memory arrays based on a 10% probability of sense amplifier failure (1 in 10). Assuming this failure probability, the mean number of memory cell read failures per memory array is the same for each set of ten memory arrays 1, 6, 8, namely, one failure per array on average. More generally, the expected number of failures will be the same for any memory grouping if the array is replicated enough. However, the standard deviations for the failures are different for the three memory groupings. For memory array 1 shown in FIG. 1A, the standard deviation is zero because the number of failures is the same for each memory array (one failure per array). For memory array 6 shown in FIG. 1B, the standard deviation is 1.05 because the number of failures for five of the arrays will be zero and the number of failures for the other five arrays will be two. For memory array 8 shown in FIG. 1B, the standard deviation is 3.16 because the number of failures for nine of the arrays will be zero and the number of failures for the tenth array will be ten. Different failure distributions can have a significant impact on design recommendations and overall circuit yield.

The foregoing analysis is overly simplified since there may be multiple conditions leading to failure of a sense amplifier, and the memory cells may similarly be subject to multiple failure conditions. Moreover, the failure conditions of the sense amplifiers and memory cells may not be independent, introducing further complexity. Numerous statistical estimation methodologies have been formulated to investigate the effects of memory cell groupings, including Gumbel distribution, bounded sample span, and count data, but each of these approaches has certain drawbacks and limitations.

A Gumbel distribution ("max distribution") provides a bound on the yield by examining the maximum of a probability density function; see for example the article by Robert Houle entitled "Simple Statistical Analysis Techniques to Determine Minimum Sense Amp Set Times," Custom Integrated Circuits Conference pp. 37-40 (September 2007). This approach relies on the worst-case expected cell failure per group, and so is a useful tool to establish early design stage upper bounds, but it can be unreasonably pessimistic. While the max distribution technique is straightforward for a single independent variable, identifying the worst-case in the presence of multiple dependent variables can require complex simulations that are inordinately expensive.

Bounded sample span is a heuristic technique which takes advantage of the fact that the number of memory cells is much larger than the number of sense amplifiers, meaning that the sense amplifier sample span for any given parameter is expected to be smaller than the span of the memory cell samples in terms of the standard deviation ($\sigma$). For example, there may be one million memory cells and 30,000 sense amplifiers in a memory array with the memory cell samples reaching up to $5\sigma$, but the sense amplifier samples will be within a smaller span (95% confidence) reaching up to $4\sigma$. The bounded sample span approach also does a good job of capturing the mean, but does not capture the nature of the variance since is pertains primarily to bounds and does not replicate the true system.

Count data is a form of statistical analysis wherein observed values are stored as whole numbers rather than, for example, binary data. Statistical treatments of count data are commonly represented by Poisson, binomial, or negative binomial distributions. This approach is based on the independent and identically distributed (IID) assumption wherein the mean and variance are equal (equidispersion). However, this assumption is often violated in real-life, i.e., underdispersion and overdispersion can occur, and this is particularly true with a grouping of many memory cells connected to a single peripheral logic element. To capture the overdispersion or under-dispersion it is necessary to model the standard deviation of the estimate as a function of the mean of the estimate. This model requires having the samples of the systems which can be very exhaustive and approximate, and is further used only when data is readily available as is the case with hardware data. Accordingly, count data also fails to provide a useful indication of failure variance associated with memory groupings.

In light of the foregoing, it would be desirable to devise an improved method of estimating correlated failure distributions for memory array designs having different groupings of memory cells, which could accurately characterize variances without introducing excessive computational requirements. It would be further advantageous if the method could easily generate a grouping-based probably of fail for a memory unit, which cannot be derived from conventional unit analysis.

SUMMARY OF THE INVENTION

It is therefore one object of the present invention to provide an improved method for statistical analysis of memory unit failures in a memory array design for an integrated circuit.

It is another object of the present invention to provide such a method which allows the circuit designer to obtain failure distributions for memory units that are correlated due to different groupings of memory cells/logic in the memory array.

It is still another object of the present invention to provide such a method which takes into consideration multiple dependent variables yet can be performed without adding excessive overhead.

The foregoing objects are achieved in a method for estimating the correlated failure distribution of memory array designs having different groupings of memory cells connected to peripheral logic elements such as sense amplifiers, by constructing a memory unit model for a given grouping of memory cells, establishing failure conditions of the memory unit model based on at least a first parameter associated with the memory cells and a second parameter associated with the peripheral logic elements, calculating a fail boundary in terms of the first and second parameters for the memory unit model based on the failure conditions, constructing a memory array model for a memory array design characterized by the fail boundary, simulating operation of the memory array model repeatedly with random values of the first parameter assigned to the memory cells and random values of the second parameter assigned to the peripheral logic elements to identify memory unit failures for each simulated operation, and calculating a mean and a variance of the memory unit failures for the memory array model. This process is repeated for each different grouping of memory cells, and an optimal architecture can thereafter be identified by selecting the grouping exhibiting the best mean and variance, subject to any other circuit requirements such as power or area for example.

The parameters may for example be threshold voltages of devices in the memory cells and peripheral logic elements, parasitics, or pulldown rate. The failure conditions of the memory unit models may be established using fast statistical analysis, and a given fail boundary is then preferably calculated by computing a center-of-gravity for corresponding failure conditions in a parametric space defined by the first and second parameters, computing an anchor point which lies on (or near) a line from an origin of the parametric space to the center-of-gravity and is a closest failing point to the origin, and computing the given fail boundary as a line (or hyperplane if there are multiple parameters) which passes through the anchor point and represents a best linear fit with other failure points within a close distance of the anchor point.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1A:
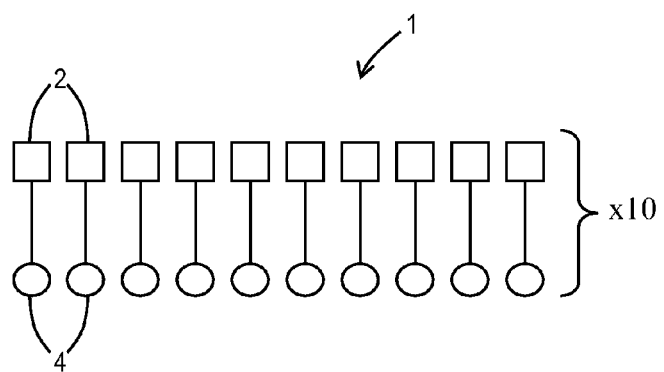
FIGS. 1A-1C are schematic diagrams showing memory arrays having different groupings of memory cells connected to sense amplifiers.
Figure 1B:
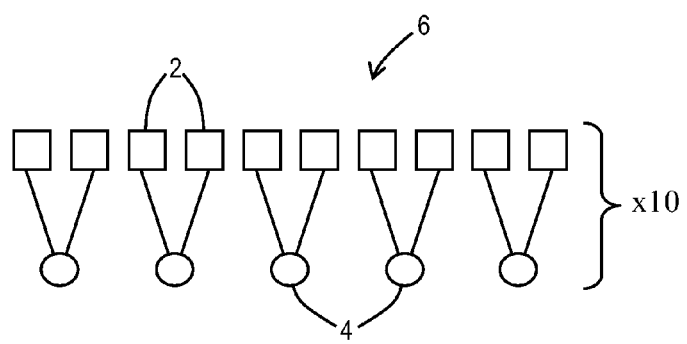
Figure 1C:
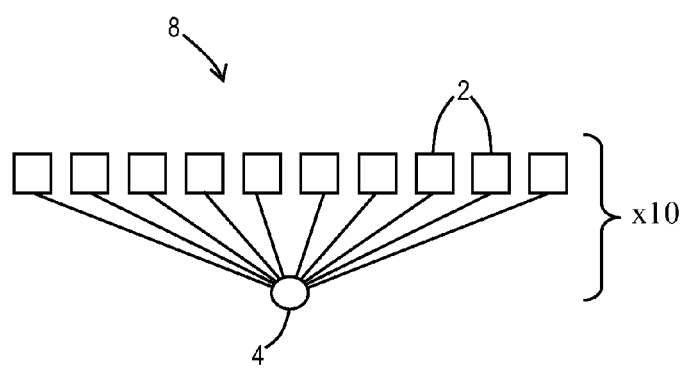
Figure 2:
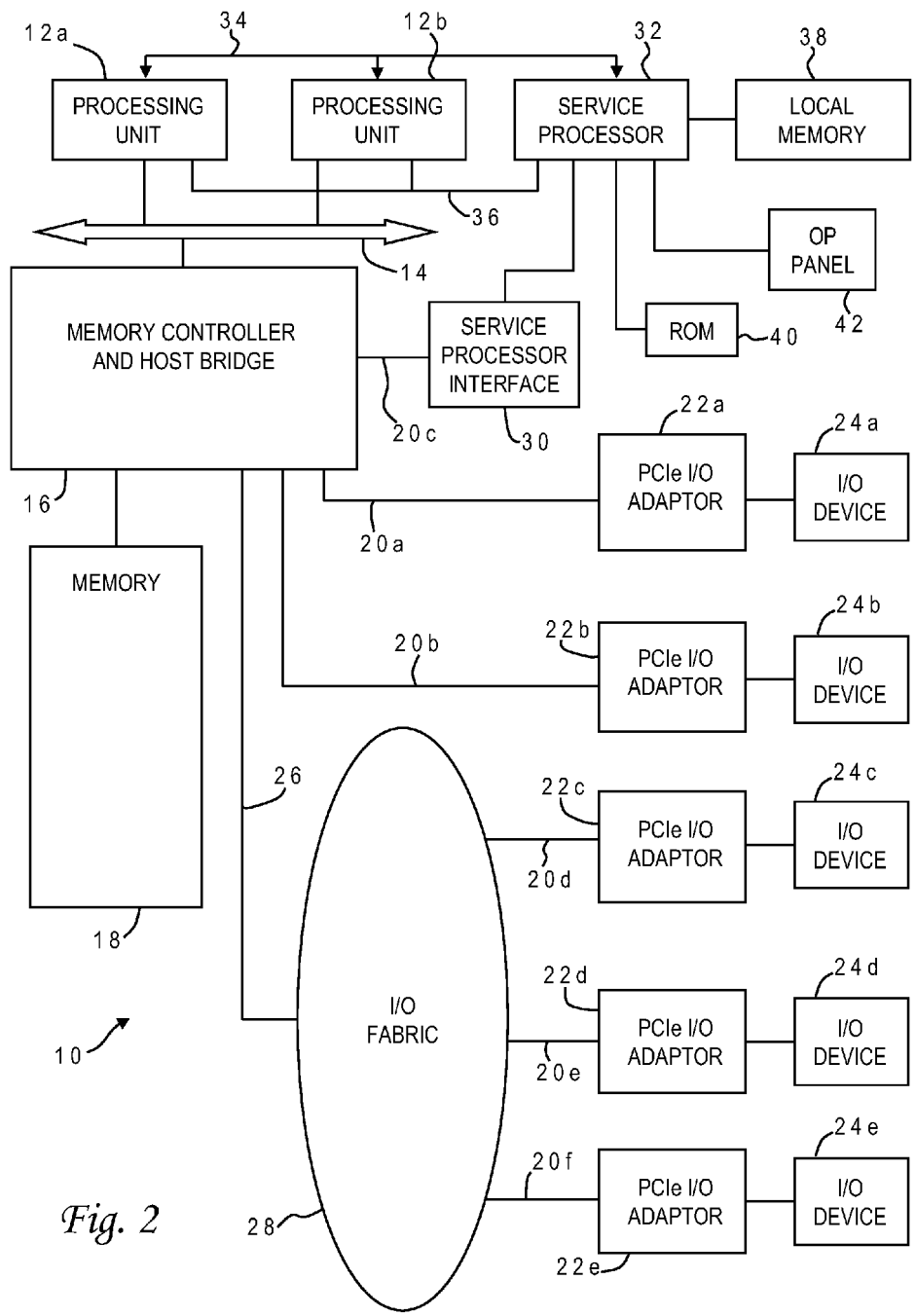
FIG. 2 is a block diagram of a computer system programmed to carry out estimation of correlated failure distributions in accordance with one implementation of the present invention.

With reference now to the figures, and in particular with reference to FIG. 2, there is depicted one embodiment 10 of a computer system in which the present invention may be implemented to carry out statistical analysis of memory arrays. Computer system 10 is a symmetric multiprocessor (SMP) system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention. The term "computer-readable storage device" does not encompass a signal propagation medium, any description in this disclosure to the contrary notwithstanding.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications and in particular the statistical correlation application of the present invention, results of which may be stored in a hard disk drive of the system (an I/O device 24). While host processors 12a, 12b are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, memory 18, and MC/HB 16. Service processor 32 may take further action based on the type of errors or defined thresholds.

While the illustrative implementation provides program instructions embodying the present invention on disk drive 36, those skilled in the art will appreciate that the invention can be embodied in a program product utilizing other computer-readable media. The program instructions may be written in the C++ programming language for an AIX environment. Computer system 10 carries out program instructions for statistical correlation of failure distributions in memory arrays having different of memory cell groupings. Accordingly, a program embodying the invention may include conventional aspects of various statistical tools, and these details will become apparent to those skilled in the art upon reference to this disclosure.

Figure 3:
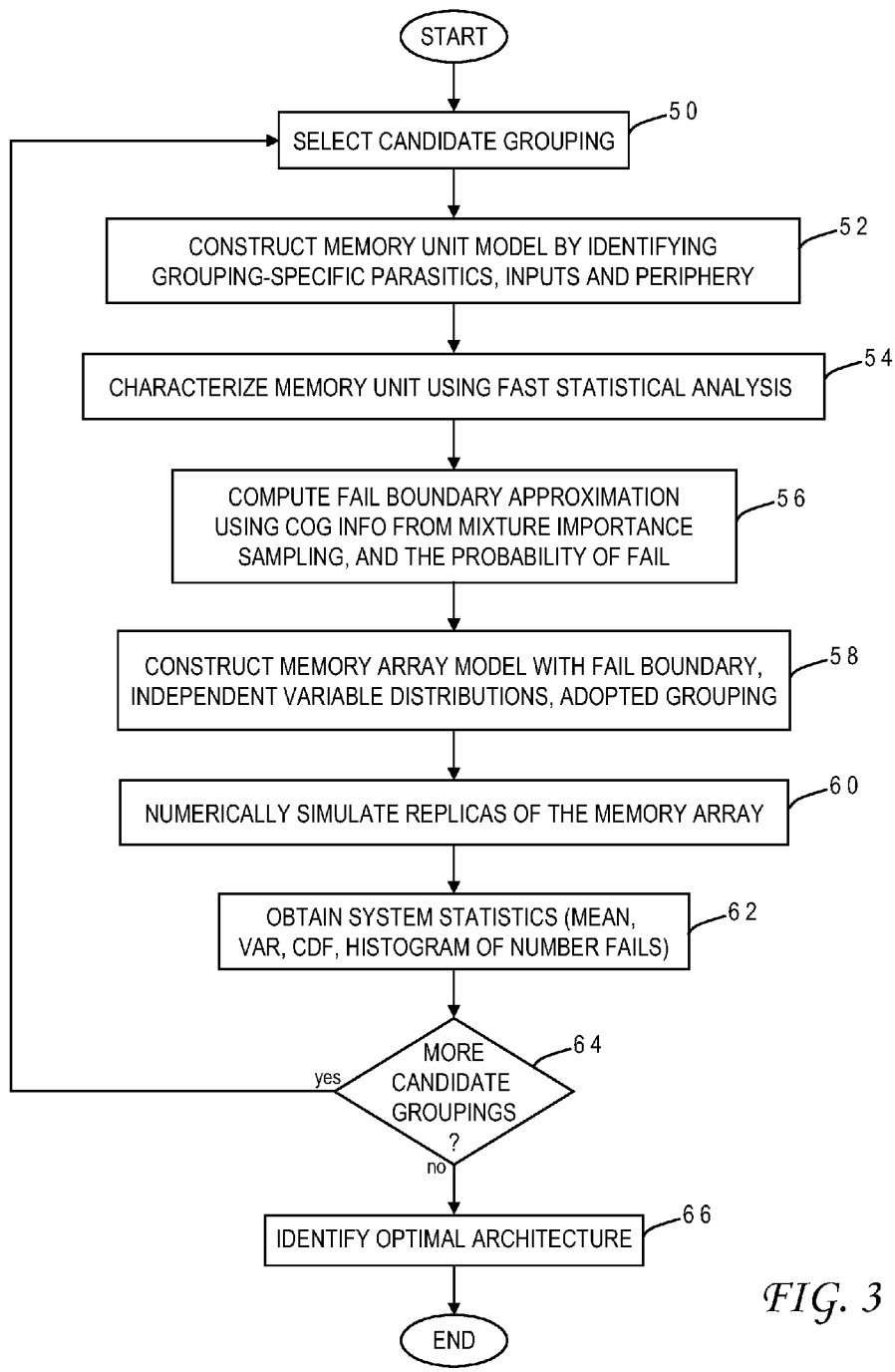
FIG. 3 is a flow chart illustrating a method of estimating correlated failure distributions for different candidate groupings of memory cells in accordance with one implementation of the present invention.

The present invention may be further understood with reference to the chart of FIG. 3 which illustrates the logical flow for estimating the correlated memory failure distribution for each different memory grouping in memory array designs in accordance with a preferred implementation. The method is carried out by appropriate program instructions stored in computer system 10, and begins by selecting a particular candidate grouping of the memory cells for the memory array design (50). The groupings are formed according to the number of memory cells which are connected to a common peripheral logic element. In exemplary embodiments the memory array designs include groupings that are powers of two, e.g., 8:1, 16:1, 64:1, and 256:1, and the total number of memory cells is on the order of one million. The invention is applicable to any type of memory cell, e.g., flip-flops used in static random-access memory (SRAM) or charged capacitors used in dynamic random-access memory (DRAM). In this example the peripheral logic is comprised of primary sense amplifiers for eDRAM design, but the invention is also applicable to other types of peripheral logic such as domino-read circuitry or sense amplifiers having cross-connected inverters between bit lines of the memory cells.

A memory unit model is then constructed for the selected candidate grouping (52). The memory unit model refers to modeling the functionality/accessibility (e.g., readability) of a single memory cell which depends not only on that cell but also on its associated sense amplifier. Since operation of the sense amplifier may further depend on how many cells are connected to it (the groupings), the memory unit model will likely be different for each different grouping. The memory unit model is thus constructed by identifying any grouping-specific parasitics (capacitance and/or resistance), inputs, periphery, or other effects such as bit-line loading. These parameters may be provided in any suitable format, preferably one useable with existing circuit simulators such as SPICE.

The memory unit model is used to characterize the memory unit and establish its failure conditions (54). This characterization is preferably accomplished using fast statistical analysis to reduce the amount of computational overhead required. Any statistical analysis may be used for this purpose, such as Monte Carlo, but the preferred technique is that disclosed in U.S. Pat. No. 7,380,225, which is hereby incorporated. According to that technique, an initial search is performed across cell circuit parameters to determine failures with respect to a set of performance variables such as writeability, read stability, and write/read delay times. For a single failure region the initial search can be a uniform sampling of the parameter space, and when enough failure points have been accumulated a mean is chosen from the mean of the detected failure points. Mixture importance sampling (MIS) is then performed to efficiently estimate the failure probability for the critical failure region. For multiple failure regions, a particular failure region can be identified by varying the memory circuit cell parameters along a random set of vectors until failures are detected.

Figure 4:
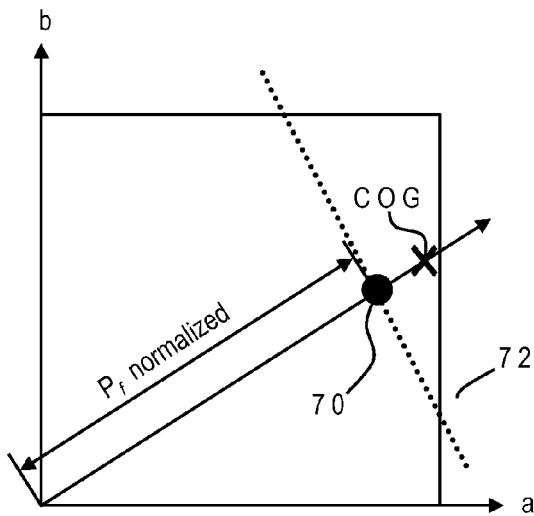
FIG. 4 is a graph depicting a fail boundary (hyperplane) for a memory unit model and a center-of-gravity for failures which are computed in accordance with one implementation of the present invention and are used to derive a probability of memory unit failure.

Once representative failure conditions are known, a fail boundary approximation is calculated for the circuit parameters (56). The fail boundary is preferably reconstructed using a center-of-gravity (CoG) approach as further illustrated in FIG. 4 which satisfies the probability of fail estimated in the previous stage. In this simplified example, failure of a memory unit is dependent upon two parameters a and b; a might for example correspond to the threshold voltage variation of a memory cell while b corresponds to the threshold voltage variation of a sense amplifier. The large "X" in FIG. 4 represents the geometric center of the failures, i.e., the CoG. A point 70 is then computed which lies on the line from the origin to the CoG and is the closest failing point to the origin. If there is no such failing point lying on this line, a failing point closest to this line and to the origin is selected. This point 70 is then used as an anchor for the fail boundary. The fail boundary should be a good approximation to the failure region and so may be further adjusted to match the estimated fail probability.

In a basic implementation of the invention, the fail boundary is simply a line (or hyperplane) which passes through anchor point 70 and is normal to the CoG-to-origin line. In a preferred implementation, the fail boundary still passes through anchor point 70 but its direction is determined by examining points where fails occur within a close distance to point 70, e.g., within the standard deviation ($\sigma$) of the failures (probability of fail normalized to an equivalent sigma number, e.g., 1% fail to 3$\sigma$). These points are used to find a best linear fit for the fail boundary (e.g., least-squares), represented in FIG. 4 as hyperplane 72. The distance from the origin to point 70 also represents the probability of fail for a memory unit ($P_f$) normalized by a factor of $\sigma$. In a more complicated implementation, the hyperplane is curved (based on a non-linear fit). Again, it is desirable to allow some fine-tuning of the failure region to enable a good match of the estimated failure probability for the unit obtained from statistical methods.

While FIG. 4 illustrates a parametric space that is two-dimensional, those skilled in the art will appreciate that in actual practice a larger number of circuit variables may be evaluated resulting in a multi-dimensional hyperplane. Other exemplary variables of interest include for example the threshold voltages ($V_t$) for multiple devices within the memory cells or sense amplifiers, parasitics, or other device characteristics of the memory cells like length, width, oxide thickness, mobility, etc. The particular parameters considered will depend upon the specific memory technology and any critical process variation parameters.

Returning to FIG. 3, after the fail boundary has been calculated, this information is used to construct a model for the entire memory array, that is, an array having a plurality of identical memory cell groupings characterized by the memory unit fail boundary for the adopted grouping (58). The memory array model allows for independent distribution of the circuit variables (process variation parameters) among the components.

Figure 5:
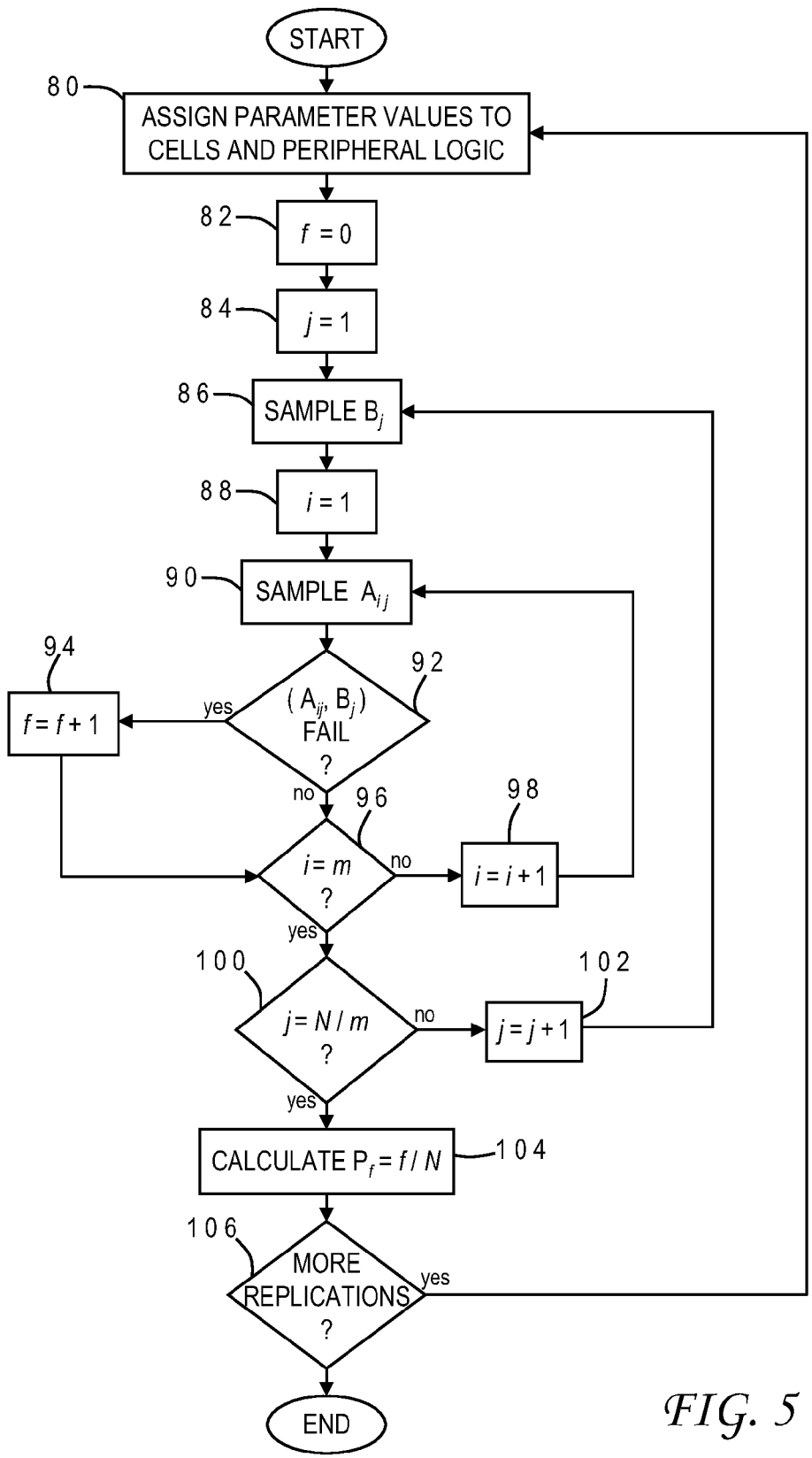
FIG. 5 is a flow chart illustrating a method for building a probability failure distribution (expected mean and variance of the number of fails, or equivalently mean and variance of the probability of fail) for a memory array in accordance with one implementation of the present invention.

Numerical simulations are then repeatedly performed using this memory array model to check for failures (60). The simulation process is further illustrated in FIG. 5, and begins by assigning different parameter values to the memory cells and the peripheral logic (80). This assignment is random, i.e., different parameters are randomly assigned to the memory cells and different parameters are randomly assigned to the peripheral logic. The random assignment may be accomplished using the natural process variation distribution, i.e., a normal distribution with a mean value of zero and an input standard deviation, e.g., 20 millivolts for threshold voltage. A failure counter f is initialized to zero (82), and a peripheral logic counter j is initialized to one (84). The first peripheral logic element ($B_j$) is sampled to determine whether it is operational (86). A memory cell counter i is initialized to one (88), and the first memory cell in the first group ($A_{ij}$) is sampled to determine whether it is operational (90). A determination is then made as to whether the current memory unit ($A_{ij}$, $B_j$) passes or fails (92). If the memory unit fails, the fail counter is incremented (94). The process continues by determining whether all of the memory cells for the current group have been sampled, i.e., whether i=m, where m is the input number of cells connected to a given peripheral logic element for the adopted grouping (96). If there are still more cells to sample in this group, the memory cell counter is incremented (98), and the process repeats at box 90. Once all of the memory units for the current group have been checked, a determination is made as to whether all of the groups have been processed, i.e., whether j=N/m, where N is the total number of cells in the memory array (100). If there are still more groups to be checked, the peripheral logic counter is incremented (102), and the process repeats at box 86.

Once all of the groups in the current memory array design have been checked, the probability of failure $P_f$ is calculated as f/N for this replication (104). Alternatively, the number of fails may simply be recorded for later calculations. If there are more replications to be carried out (106), the process returns to box 80 and assigns a new set of parameter values to the cells and peripheral logic. The desired number of replications depends upon the particulars of the system, but the simulations are generally repeated until a high confidence level is reached for variance of the expected number of fails (or variance of the expected probability of fail) which may be determined by a convergence check. In the envisioned implementations, the number of replications will be on the order of 100 to 10,000.

Returning again to FIG. 3, once the data from the numerical simulations are available computer system 10 calculates various statistics including at least the mean and variance of $P_f$ for the current memory cell grouping, and stores these values for later analysis (62). Other statistics useful to the designer may additionally be calculated such as the cumulative distribution function (CDF), or a histogram for the number of failures. The entire process of obtaining these statistical values is repeated for each different candidate grouping (64). Once all of the groupings have been so processed, the optimal grouping architecture is identified based on the statistical values (66). In particular the present invention preferably selects the candidate grouping which has the best mean and best variance, i.e., the lowest values for these statistical values, provided that grouping still results in a design that does not violate any circuit requirements such as power or area.

Figure 6:
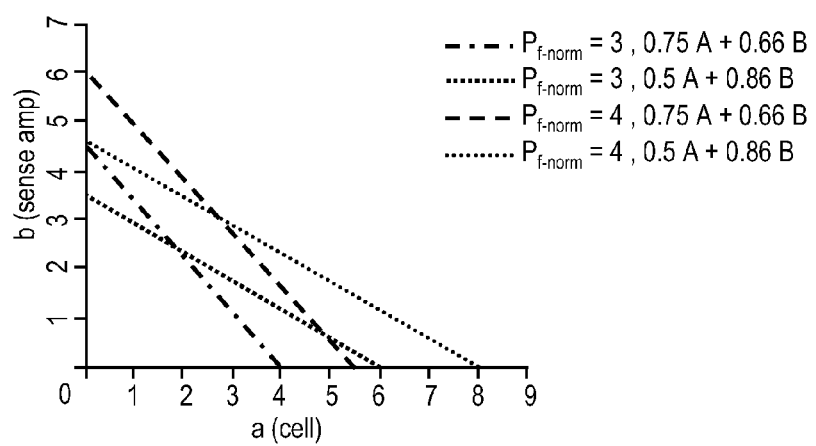
FIG. 6 is a graph depicting four hyperplanes for four different examples of memory arrays constructed in accordance with one implementation of the present invention.

The present invention is particularly advantageous because it can obtain the correlated fail distributions independent of any underlying assumptions for the memory unit, i.e., assumptions attributing the fails purely to the cell or sense amp, and independent of which element of the unit impacts fails most under given operating conditions (supply voltage, temperature, etc.). For example, FIG. 6 presents an illustration of different memory unit failure regions (determined by unit $P_{f-norm}$ and a hyperplane) that can result from different cell/sense amp designs. The failure region may be modeled by considering the constraints $aA+bB<P_{f-norm}$ and $a^2+b^2=1$, where A and B are the influence parameters (such as cell and peripheral threshold voltages), and a and b are variable coefficients. FIG. 6 illustrates a graph of four different hyperplanes for these two memory unit variables. Two of the hyperplanes represent a normalized unit $P_f$ of 3, with coefficients of a=0.75 and b=0.66 for the dash-dot line, and a=0.5 and b=0.86 for the square-dot lines. The other two hyperplanes represent a normalized unit $P_f$ of 4, with the same coefficients of a=0.75 and b=0.66 for the dashed line, and a=0.5 and b=0.86 for the round-dot lines.

Hence, the present invention may be used to study different memory array designs as a function of the memory unit parameters of interest. The memory units can be different (strong cell, low-power cell, or high-speed speed sense amp design, etc.) for a given type of array design, and the method still captures the sensitizations properly.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been disclosed in the context of a two-level memory unit (memory cell plus sense amplifier), it is also applicable to higher-level hierarchies, e.g., wherein a sense amplifier for a local evaluation circuit is further connected to a sense amplifier of a global evaluation circuit. It is therefore contemplated that such modifications can be made without departing from the spirit or scope of the present invention as defined in the appended claims.

What is claimed is:

1. A method carried out by a computer system for estimating correlated failure distributions of memory array designs having different groupings of memory cells connected to peripheral logic elements, the method comprising:
    constructing memory unit models for the different groupings of memory cells based on at least a first parameter associated with the memory cells and a second parameter associated with the peripheral logic elements;
    establishing failure conditions of the memory unit models;
    calculating fail boundaries in terms of the first and second parameters for the memory unit models based on the failure conditions;
    constructing memory array models for the memory array designs characterized by the fail boundaries;
    simulating operation of the memory array models repeatedly with random values of the first parameter assigned to the memory cells and random values of the second parameter assigned to the peripheral logic elements to identify memory unit failures for each simulated operation; and
    calculating a mean and a variance of the memory unit failures for each of the memory array models.

2. The method of claim 1 wherein:
    the first parameter is a threshold voltage of a first device in the memory cells; and
    the second parameter is a threshold voltage of a second device in the peripheral logic elements.

3. The method of claim 1 wherein the peripheral logic elements are sense amplifiers.

4. The method of claim 1 wherein the failure conditions of the memory unit models are established using statistical analysis.

5. The method of claim 1, further comprising:
    identifying which of the memory array models has an optimal mean and variance.

6. A method carried out by a computer system for estimating correlated failure distributions of memory array designs having different groupings of memory cells connected to peripheral logic elements, the method comprising:
    constructing memory unit models for the different groupings of memory cells based on at a plurality of parameters associated with the memory cells or the peripheral logic elements;
    establishing failure conditions of the memory unit models;
    calculating fail boundaries in terms of the plurality of parameters for the memory unit models by computing a center-of-gravity for corresponding failure conditions in a parametric space defined by the plurality of parameters, computing an anchor point which lies on a line from an origin of the parametric space to the center-of-gravity and is a closest failing point to the origin, and computing the given fail boundary as a line which passes through the anchor point and represents a linear fit with other failure points within a close distance of the anchor point;
    constructing memory array models for the memory array designs characterized by the fail boundaries;
    simulating operation of the memory array models repeatedly with random values of the plurality of parameters assigned to the memory cells and peripheral logic elements to identify memory unit failures for each simulated operation, wherein said simulating is repeated for a given memory array model until a corresponding standard deviation for memory unit failures of the given memory array model converges;
    calculating a mean and a variance of the memory unit failures for each of the memory array models; and
    identifying which of the memory array models has an optimal mean and variance.

7. The method of claim 1, wherein the fail boundary passes through an anchor point, wherein a direction of the fail boundary is determined by examining a point where failure occurs within a pre-determined distance from the anchor point.

8. The method of claim 1, wherein the fail boundary forms a hyperplane fitting a plurality of failure points within a pre-determined distance from an anchor point of the fail boundary.

9. The method of claim 1, wherein the first parameter and the second parameter are each a critical process variation parameters.

10. The method of claim 1, wherein the first parameter and the second parameter are each one of (i) a parasitics, and (ii) a pulldown rate.

11. A computer system comprising:
    one or more processors which process program instructions;
    a memory device connected to said one or more processors;
    program instructions residing in said memory device for estimating correlated failure distributions of memory array designs having different groupings of memory cells connected to peripheral logic elements, by constructing memory unit models for the different groupings of memory cells based on at least a first parameter associated with the memory cells and a second parameter associated with the peripheral logic elements;
    program instructions residing in said memory device for establishing failure conditions of the memory unit models;
    program instructions residing in said memory device for calculating fail boundaries in terms of the first and second parameters for the memory unit models based on the failure conditions;
    program instructions residing in said memory device for constructing memory array models for the memory array designs characterized by the fail boundaries;
    program instructions residing in said memory device for simulating operation of the memory array models repeatedly with random values of the first parameter assigned to the memory cells and random values of the second parameter assigned to the peripheral logic elements to identify memory unit failures for each simulated operation; and program instructions residing in said memory device for calculating a mean and a variance of the memory unit failures for each of the memory array models.

12. The computer system of claim 11 wherein:
the first parameter is a threshold voltage of a first device in the memory cells; and
the second parameter is a threshold voltage of a second device in the peripheral logic elements.

13. The computer system of claim 11 wherein the peripheral logic elements are sense amplifiers.

14. The computer system of claim 11 wherein the failure conditions of the memory unit models are established using statistical analysis.

15. The computer system of claim 11 wherein said program instructions further identify which of the memory array models has an optimal mean and variance.

16. A computer program product comprising:
a computer-readable storage device; and
program instructions residing in said computer-readable storage device for estimating correlated failure distributions of memory array designs having different groupings of memory cells connected to peripheral logic elements, by constructing memory unit models for the different groupings of memory cells based on at least a first parameter associated with the memory cells and a second parameter associated with the peripheral logic elements, establishing failure conditions of the memory unit models, calculating fail boundaries in terms of the first and second parameters for the memory unit models based on the failure conditions, constructing memory array models for the memory array designs characterized by the fail boundaries, simulating operation of the memory array models repeatedly with random values of the first parameter assigned to the memory cells and random values of the second parameter assigned to the peripheral logic elements to identify memory unit failures for each simulated operation, and calculating a mean and a variance of the memory unit failures for each of the memory array models.

17. The computer program product of claim 16 wherein:
the first parameter is a threshold voltage of a first device in the memory cells; and
the second parameter is a threshold voltage of a second device in the peripheral logic elements.

18. The computer program product of claim 16 wherein the peripheral logic elements are sense amplifiers.

19. The computer program product of claim 16 wherein the failure conditions of the memory unit models are established using statistical analysis.

20. The computer program product of claim 16 wherein said program instructions further identify which of the memory array models has an optimal mean and variance.

* * * * *